(12) United States Patent
Li

(10) Patent No.: US 11,678,438 B2
(45) Date of Patent: Jun. 13, 2023

(54) ELECTRONIC DEVICE

(71) Applicant: PANELSEMI CORPORATION, New Taipei (TW)

(72) Inventor: Chin-Tang Li, Tainan (TW)

(73) Assignee: PANELSEMI CORPORATION, New Taipei (TW)

( * ) Notice: Subject to any disclaimer, the term of this patent is extended or adjusted under 35 U.S.C. 154(b) by 36 days.

(21) Appl. No.: 17/562,614

(22) Filed: Dec. 27, 2021

(65) Prior Publication Data

US 2022/0210918 A1    Jun. 30, 2022

(30) Foreign Application Priority Data

Dec. 30, 2020  (TW) ................................. 109146962
Jun. 15, 2021  (TW) ................................. 110121777

(51) Int. Cl.
*H05K 1/18*     (2006.01)
*H05K 1/14*     (2006.01)
*H05K 1/11*     (2006.01)

(52) U.S. Cl.
CPC ............. *H05K 1/181* (2013.01); *H05K 1/115* (2013.01); *H05K 1/144* (2013.01); *H05K 2201/041* (2013.01); *H05K 2201/09609* (2013.01); *H05K 2201/10121* (2013.01)

(58) Field of Classification Search
CPC .......... H05K 1/18; H05K 2201/10121; H05K 2201/09609; H05K 1/115; H05K 2201/041; H05K 1/144; H05K 1/181
USPC ........................................................ 361/783
See application file for complete search history.

(56) References Cited

FOREIGN PATENT DOCUMENTS

CN           110087392 A       8/2019
CN           111753778 A      10/2020

*Primary Examiner* — Tremesha S Willis
(74) *Attorney, Agent, or Firm* — Muncy, Geissler, Olds & Lowe, P.C.

(57) ABSTRACT

An electronic device includes a supporting board, an electrical board and electronic units. The supporting board includes a circuit layer. The electrical board has a board body, through holes through the board body, an electrical layer on the board body, and primary conductive elements respectively in the through holes. The board body has opposite first and second surfaces. The through holes communicate with the first surface and the second surface. The primary conductive elements electrically connect the electrical layer to the circuit layer. The electronic units are arranged on the first surface. Each electronic unit partially overlaps with one corresponding through hole in a projection direction of the electrical board. Each electronic unit has an electronic component and a secondary conductive element electrically connecting the electronic component to the electrical layer. The secondary conductive elements and the primary conductive elements are arranged in dislocation in the projection direction.

20 Claims, 9 Drawing Sheets

ELECTRONIC DEVICE

CROSS REFERENCE TO RELATED APPLICATIONS

This Non-provisional application claims priority under 35 U.S.C. § 119(a) on Patent Application No(s). 109146962 filed in Taiwan, Republic of China on Dec. 30, 2020, and 110121777 filed in Taiwan, Republic of China on Jun. 15, 2021, the entire contents of which are hereby incorporated by reference.

BACKGROUND

Technology Field

The present disclosure relates to an electronic device and, in particular, to an electronic device with a novel electrical connection technology.

Description of Related Art

In the field of electronic device manufacturing, Surface Mount Technology (SMT) is a technology for soldering electronic components on the surface of, for example, a printed circuit board (PCB). SMT can sufficiently reduce the volume of electronic products to achieve the goal of lighter, thinner and smaller.

Conventionally, the solder paste is usually provided to bond the electronic components (e.g., surface mounted devices) to the contact points of circuit board. In details, the solder paste is printed on the solder pads (or pads) of the circuit board that need to be soldered to the component, and then the electronic component is placed on the soldering pads so that the pins of the electronic component correspond to the positions of the solder paste. Afterwards, the solder paste is melted in a high-temperature reflow oven, and the liquid solder paste can cover the pins of the electronic component. After cooling, the electronic component can be soldered on the circuit board.

SUMMARY

This disclosure provides an electronic device with a novel electrical connection technology.

One or more exemplary embodiments of this present disclosure provide an electronic device, which includes a supporting board, an electrical board, and a plurality of electronic units. The supporting board is provided with a circuit layer. The electrical board has a board body, a plurality of through holes passing through the board body, an electrical layer arranged on the board body, and a plurality of primary conductive elements respectively arranged in the through holes. The board body is defined with a first surface and a second surface opposite to each other. The through holes communicate with the first surface and the second surface of the board body. The primary conductive elements electrically connect the electrical layer to the circuit layer of the supporting board. The electronic units are arranged on the first surface of the board body. Each of the electronic units is partially overlapped with one of the through holes in a projection direction of the electrical board. Each electronic unit has an electronic component and a secondary conductive element electrically connecting the electronic component to the electrical layer. The secondary conductive elements of the electronic units and the primary conductive elements of the electrical board are arranged in dislocation in the projection direction of the electrical board.

In one exemplary embodiment, each of the electronic units defines a plurality of corners, and one of the corners of each electronic unit is overlapped by one of the through holes in the projection direction of the electrical board.

In one exemplary embodiment, each electronic unit defines a plurality of corners, and one of the through holes overlaps the corners of one or ones of the electronic units in the projection direction of the electrical board.

In one exemplary embodiment, the electronic units are a plurality of electronic structures, each electronic structure includes a carrier board, and the electronic component is arranged on the carrier board.

In one exemplary embodiment, the electronic units form an electronic structure, the electronic structure includes a carrier board, and the electronic components of the electronic units are arranged on the carrier board.

In one exemplary embodiment, the electronic units are arranged in an m*n array, and cover at least one of the through holes in the projection direction of the electrical board, and m and n are equal or unequal positive integers.

In one exemplary embodiment, the electronic units are arranged in a 2*2 array.

In one exemplary embodiment, each electronic unit includes a plurality of secondary conductive elements, and each secondary conductive element electrically connects the corresponding electronic component to the electrical layer.

In one exemplary embodiment, each electronic unit includes a plurality of electronic components.

In one exemplary embodiment, the electronic component is a micro photoelectric chip.

In one exemplary embodiment, the electronic component is a driving component.

In one exemplary embodiment, the electrical board further includes a plurality of driving components, and the driving components are respectively corresponding to the electronic components of the electronic units.

In one exemplary embodiment, the electronic device includes a plurality of electrical boards.

In one exemplary embodiment, the carrier board is a rigid board, a resilient board, or a composite board.

In one exemplary embodiment, the carrier board is a transparent board.

In one exemplary embodiment, a ratio of the projection area of the electronic unit to the projection area of the electronic component is greater than or equal to 5.

In one exemplary embodiment, the electronic component defines a component width, which is less than or equal to 80 mils.

In one exemplary embodiment, the electronic component defines a component width, which is less than or equal to 12 mils.

In one exemplary embodiment, the electronic component defines a component width, which is greater than or equal to 0.005 mm.

In one exemplary embodiment, the carrier board is defined with a working surface and a connecting surface opposite to each other, the electronic components are arranged on the working surface, the carrier board has a conductive layer, a through hole communicating the working surface and the connecting surface, and the secondary conductive elements pass through the corresponding through holes for electrically connecting the conductive layer to the electrical layer of the electrical board.

In one exemplary embodiment, each of the supporting board and the board body of the electrical board is a rigid board, a resilient board or a composite board.

In one exemplary embodiment, the supporting board or/and the board body of the electrical board is a transparent board.

One or more exemplary embodiments of this present disclosure provide an electronic device, which includes a supporting board, an electrical board and a plurality of electronic units. The supporting board is provided with a circuit layer. The electrical board has a board body, an electrical layer arranged on the board body, and a plurality of primary conductive elements electrically connected to the electrical layer. The board body is defined with a first surface and a second surface opposite to each other, and the primary conductive elements electrically connect the electrical layer to the circuit layer of the supporting board. The electronic units are arranged on the first surface of the board body. Each of the electronic units is partially overlapped with one of the primary conductive elements in a projection direction of the electrical board. Each of the electronic units has an electronic component and a secondary conductive element electrically connecting the electronic component to the electrical layer. The secondary conductive elements of the electronic units and the primary conductive elements of the electrical board are arranged in dislocation in the projection direction of the electrical board.

In one exemplary embodiment, the electronic unit is a surface mounted device.

In one exemplary embodiment, each of the electronic units defines a plurality of corners, and one of the corners of each electronic unit is overlapped by one of the primary conductive elements in the projection direction of the electrical board.

In one exemplary embodiment, each electronic unit defines a plurality of corners, and one of the primary conductive elements overlaps the corners of one or ones of the electronic units in the projection direction of the electrical board.

In one exemplary embodiment, the electronic units are a plurality of electronic structures, each electronic structure includes a carrier board, and the electronic component is arranged on the carrier board.

In one exemplary embodiment, the electronic component is a micro photoelectric chip.

In one exemplary embodiment, the electronic unit further includes an encapsulation layer for encapsulating the electronic component.

In one exemplary embodiment, the electronic units form an electronic structure, the electronic structure includes a carrier board, and the electronic components of the electronic units are arranged on the carrier board.

In one exemplary embodiment, the electronic units are arranged in an m*n array, and cover at least one of the primary conductive elements in the projection direction of the electrical board, and m and n are equal or unequal positive integers.

In one exemplary embodiment, the electronic units are arranged in a 4*4 array.

In one exemplary embodiment, each electronic unit includes a plurality of secondary conductive elements, and each secondary conductive element electrically connects the corresponding electronic component to the electrical layer.

In one exemplary embodiment, the secondary conductive element of each electronic unit is a solder bump.

In one exemplary embodiment, the electrical board further includes a plurality of driving components, and the driving components are respectively corresponding to the electronic components of the electronic units.

In one exemplary embodiment, the driving component is a thin-film transistor (TFT) or an integrated circuit (IC).

BRIEF DESCRIPTION OF THE DRAWINGS

The disclosure will become more fully understood from the detailed description and accompanying drawings, which are given for illustration only, and thus are not limitative of the present disclosure, and wherein.

DETAILED DESCRIPTION OF THE DISCLOSURE

The present disclosure will be apparent from the following detailed description, which proceeds with reference to the accompanying drawings, wherein the same references relate to the same elements.

Figure 1A:
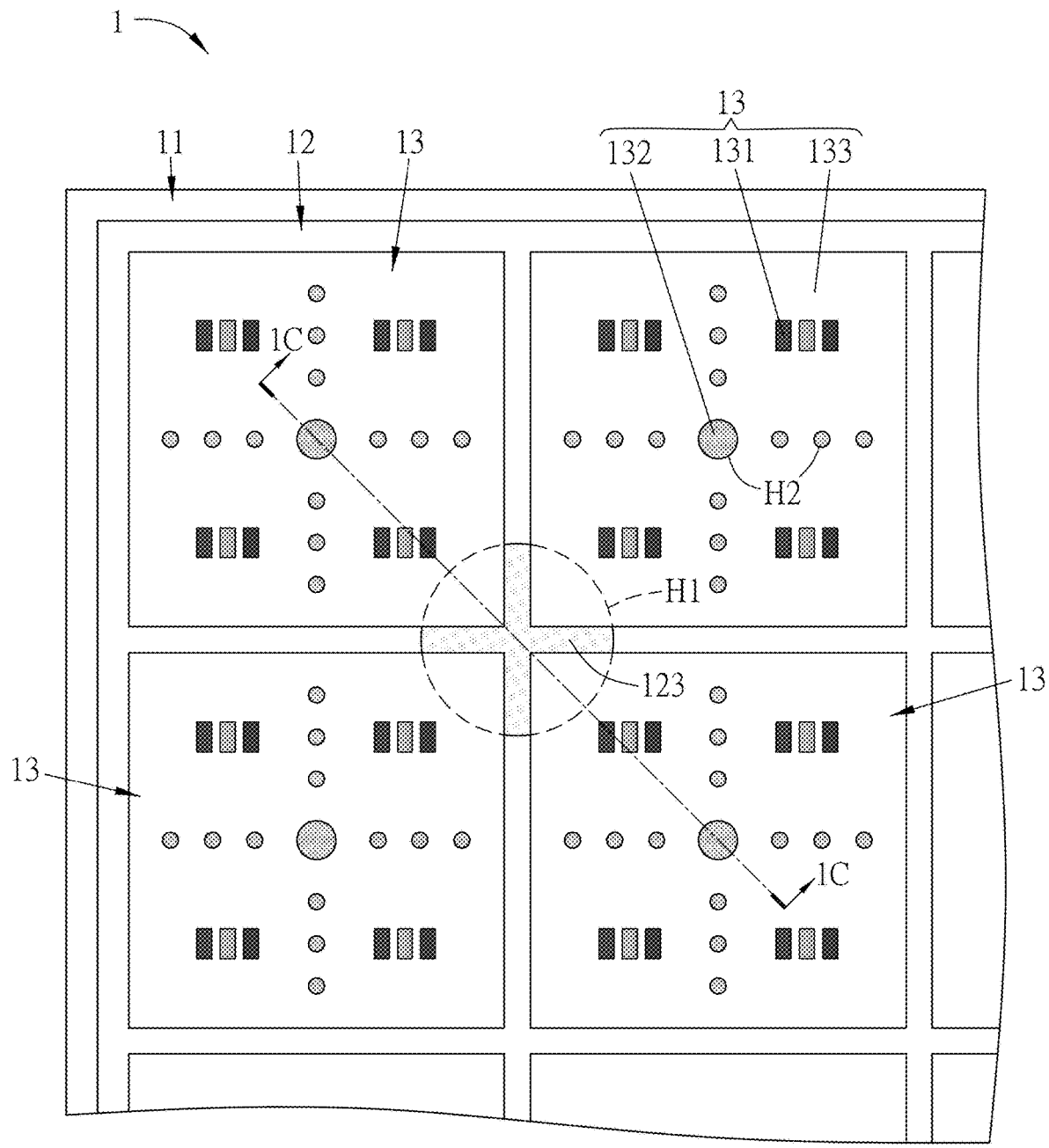
FIG. 1A is a schematic diagram showing a part of an electronic device according to an embodiment of this disclosure.
Figure 1B:
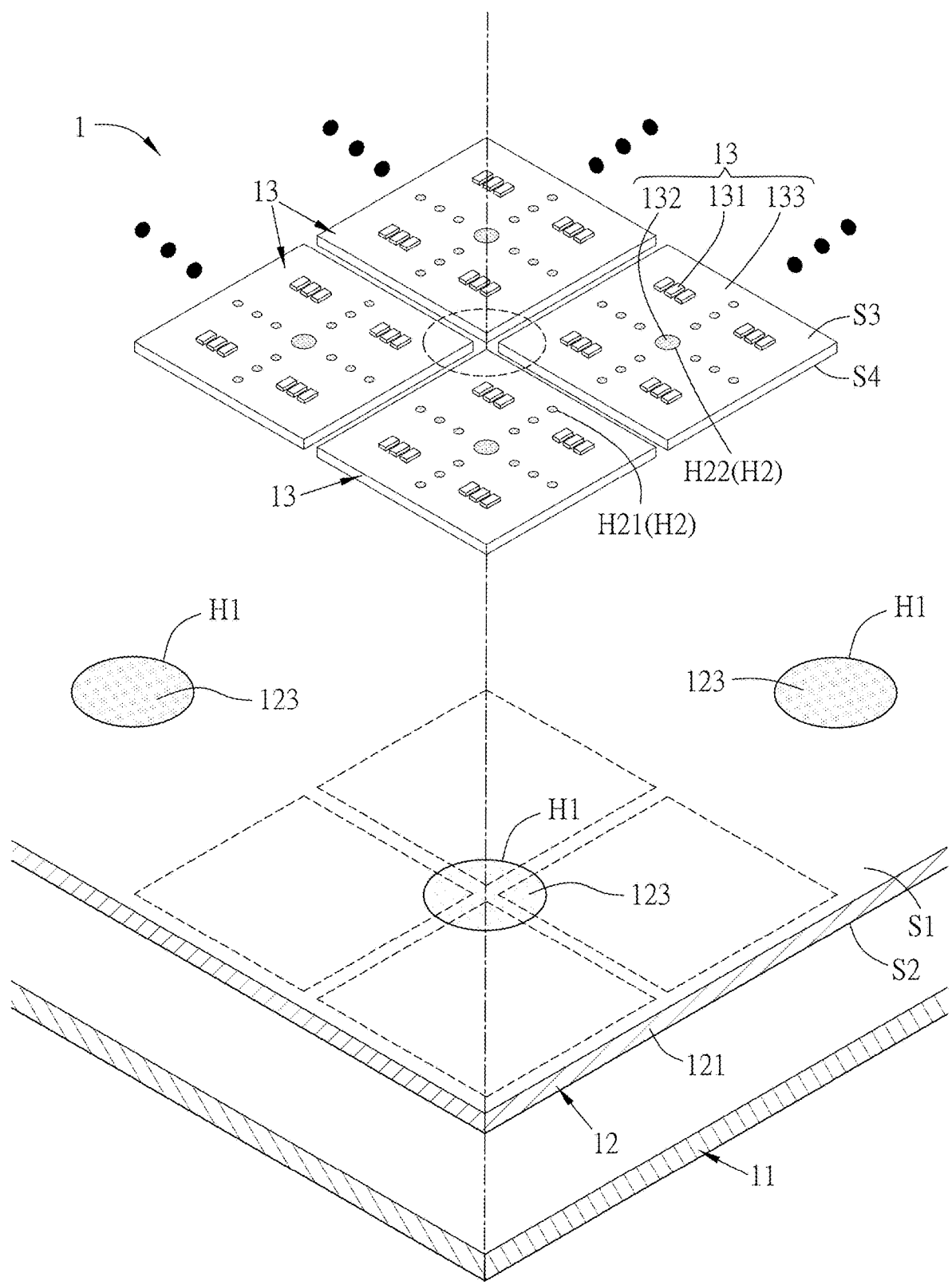
FIG. 1B is an exploded view of a part of the electronic device of FIG. 1A.
Figure 1C:
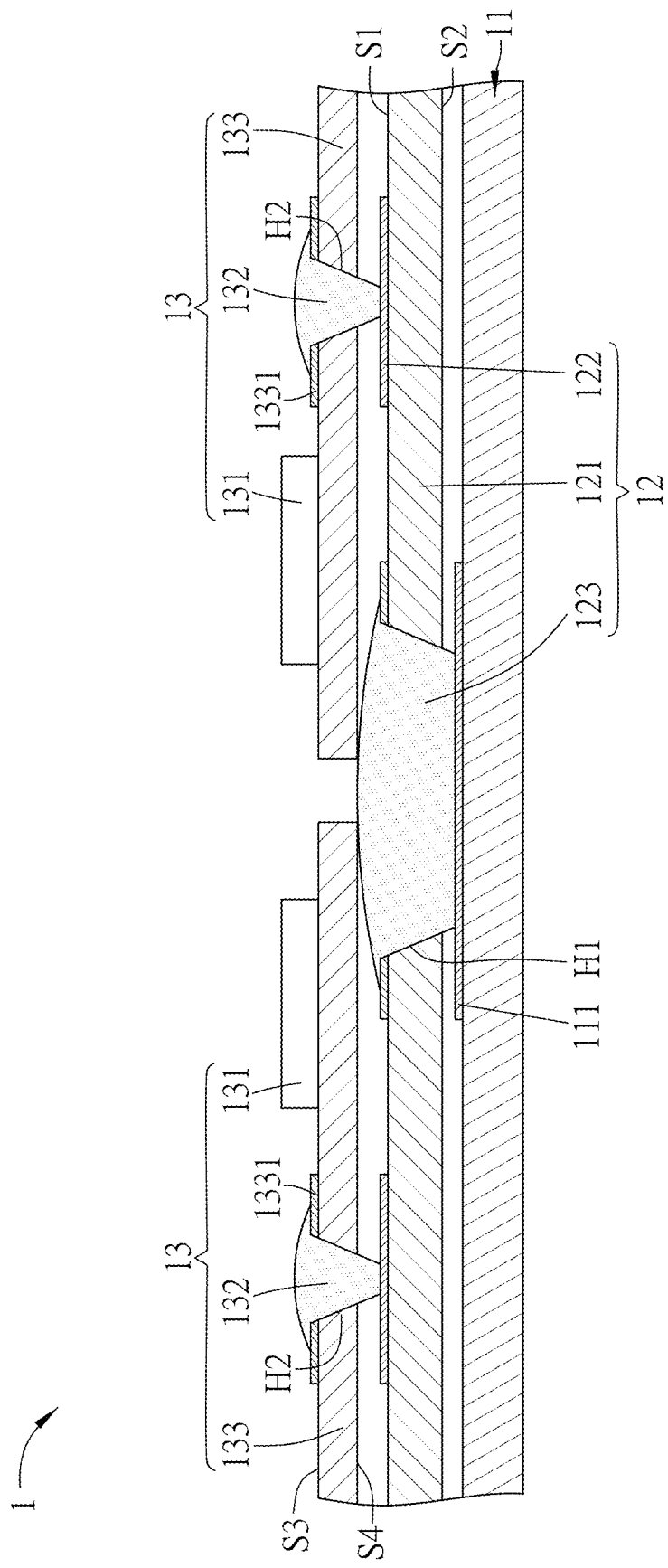
FIG. 1C is a sectional view of the electronic device of FIG. 1A along the line 1C-1C.

FIG. 1A is a schematic diagram showing a part of an electronic device 1 according to an embodiment of this disclosure, FIG. 1B is an exploded view of a part of the electronic device 1 of FIG. 1A, and FIG. 1C is a sectional view of the electronic device 1 of FIG. 1A along the line 1C-1C.

Referring to FIGS. 1A to 1C, the electronic device 1 of this embodiment includes a supporting board 11, an electrical board 12, and a plurality of electronic units 13. The electrical board 12 is arranged on the supporting board 11, and the electronic units 13 are arranged on the electrical board 12. In some embodiments, the electrical board 12 can be arranged on the supporting board 11 by, for example but not limited to, adhesion, and electrically connected to the supporting board 11. In this case, the electrical board 12 and the supporting board 11 are connected to each other by insulation adhesive. In some embodiments, the electronic units 13 can be arranged on the electrical board 12 by, for example but not limited to, adhesion, and electrically connected to the electrical board 12. In this case, the electronic units 13 and the electrical board 12 are connected to each other by (insulation) adhesive.

The supporting board 11 can provide the supporting function and is further provided with a circuit layer 111 (see FIG. 1C) for electrical connection. The circuit layer 111 can be arranged on a surface of the supporting board 11 facing the electrical board 12 or/and away from the electrical board 12. Herein, the circuit layer 111 is, for example, arranged on the surface of the supporting board 11 facing the electrical board 12. In some embodiments, the circuit layer 111 includes a conductive layer or wires for transmitting the electrical signals for the electronic units 13. The supporting board 11 can be a rigid board, a semi-rigid board, a resilient board, or a composite board, and this disclosure is not limited thereto.

The electrical board 12 has a board body 121, a plurality of through holes H1, an electrical layer 122, and a plurality of primary conductive elements 123. The board body 121 is defined with a first surface S1 and a second surface S2 opposite to each other. The through holes H1 pass through the board body 121 and communicate with the first surface S1 and the second surface S2 of the board body 121. In this case, the second surface S2 of the board body 121 faces toward the supporting board 11. In this embodiment, the electrical layer 122 includes a conductive layer for transmitting electrical signals and is arranged on, for example but not limited to, the first surface S1 of the board body 121. The primary conductive elements 123 are respectively arranged in the through holes H1 of the electrical board 12, and each primary conductive element 123 is slightly protruded from the corresponding through hole H1. The primary conductive elements 123 electrically connect the electrical layer 122 to the circuit layer 111 of the supporting board 11. In other words, the electrical layer 122 of the electrical board 12 is electrically connected to the circuit layer 111 of the underneath supporting board 11 via the primary conductive elements 123, which are located in the corresponding through holes H1, so that the electrical signals can be transmitted through the electrical layer 122, the primary conductive elements 123 and the circuit layer 111. Herein, the board body 121 usually has a uniform thickness, but this disclosure is not limited thereto. If the board body 121 has a non-uniform thickness, the thickness can be defined as the minimum thickness of the entire board body 121. In addition, the material of the circuit layer 111 or/and the electrical layer 122 can include, for example, metal (e.g. gold, copper, or aluminum), a combination of the metals, a combination of alloys of the metals, or any of other conductive materials. In some embodiments, the insides of the through holes H1 can be further processed by electroplating, chemical plating or evaporating. In some embodiments, each of the supporting board 11 and the board body 121 of the electrical board 12 can be a rigid board, a semi-rigid board, a resilient board, or a composite board. In some cases, the semi-rigid board could be elaborated as the resilient board, or one of the composite boards. When the supporting board 11 and the board body 121 of the electrical board 12 are both resilient boards, the electronic device 1 can be manufactured as a flexible electronic device, which can be easily curved and carried. In some embodiments, the supporting board 11/and the board body 121 of the electrical board 12 can be a transparent board or a non-transparent board. When the supporting board 11 and the board body 121 of the electrical board 12 are transparent boards, the electronic device 1 can be manufactured as a transparent electronic product such as, for example but not limited to, a transparent display device. When the supporting board 11 and the board body 121 of the electrical board 12 are transparent and resilient boards, it is possible to achieve the function of two-way light transmission. For example, if the electronic components of the electronic units 13 are Mini LEDs or Micro LEDs, the electronic device 1 can be manufactured as a two-way light transmission flexible light source or flexible display device.

The electronic units 13 are arranged on the first surface S1 of the board body 121, and each of the electronic units 13 is partially overlapped with one of the through holes H1 in a projection direction of the electrical board 12 (see FIG. 1A). Herein, the projection direction of the electrical board 12 is the direction perpendicular to the first surface S1 of the board body 121. In this embodiment, every four adjacent electronic units 13 correspond to one through holes H1, and each of the four electronic units 13 is partially overlapped with the corresponding through hole H1 in the projection direction of the electrical board 12. To be noted, each electronic unit 13 defines a plurality of corners, and one of the corners of at least one electronic unit 13 is overlapped by one of the through holes H1 in the projection direction of the electrical board 12. In some embodiments, each of the four electronic units 13 has one corner overlapped by one of the through holes H1 in the projection direction of the electrical board 12. To be noted, one of the through holes H1 overlaps the corresponding corners of one or different ones of the four electronic units 13 in the projection direction of the electrical board 12. In some embodiments, for example, the electronic units 13 can be rectangle, and arranged in an m*n array, wherein m and n are equal or unequal positive integers. The electronic units 13 covers at least one of the through holes H1 in the projection direction of the electrical board 12. In this embodiment, the four electronic units 13 are arranged in a 2*2 array and cover one single through hole H1, or the four electronic units 13 are arranged in a 4*4 array and cover one single through hole H1, but this disclosure is not limited thereto. In different embodiments, the electronic units 13 can be arrange in a different way such as a one-dimensional array or an irregular arrangement, and this disclosure is not limited thereto. To be understood, the shape and corners of each electronic unit 13 are not limited. The corner of each electronic unit 13 may extend to the geometric center or mass center of each electronic unit 13. In this embodiment, each electronic unit 13 has four corners, and each of the four electronic units 13 has one corner corresponding to one of the through holes H1 in the projection direction of the electrical board 12, so that the four corners can be overlapped by the corresponding through hole H1. To be noted, a gap is formed between two adjacent carrier boards 133 as shown in FIG. 1A for easy comprehension. To be understood, in practice, the two adjacent carrier boards 133 can be tightly connected without forming any gap, or the gap between two adjacent electronic units 13 respectively on two adjacent carrier boards 133 is equal to the gap between two adjacent electronic units 13 on the same carrier board 133. This configuration can have the advantages of decreasing the size of the entire electronic device 1, increasing the density of the electronic units 13 in the electronic device 1, or making the tiled carrier boards 133 have visual consistency.

Each electronic unit 13 has at least one electronic component 131 and at least one secondary conductive element 132. The secondary conductive element 132 is configured to electrically connect the electronic component 131 to the electrical layer 122 of the electrical board 12. That is, the electronic component 131 is electrically connected to the electrical layer 122 of the electrical board 12 via the secondary conductive element 132. In this embodiment, each electronic unit 13 has a plurality of electronic components 131 and a plurality of secondary conductive elements 132, and each secondary conductive element 132 electrically connects the corresponding electronic component 131 to the electrical layer 122. In other words, each electronic component 131 is electrically connected to the electrical layer 122 of the electrical board 12 via the corresponding secondary conductive element 132. In some embodiments, the material of the primary conductive element 123 or the secondary conductive element 132 can be, for example but not limited to, a solder paste, a copper paste, a silver paste, or a combination thereof.

In some embodiments, the electronic component 131 can be a millimeter or micrometer photoelectric chip or photoelectric package. In some embodiments, the electronic component 131 can at least include, for example but not limited to, an LED chip, a Mini LED chip, a Micro LED chip, a Micro sensor chip, or at least one package, or a photoelectric chip or package with an unlimited size such as in millimeters, micrometers or smaller. To be noted, the millimeter package can include the micrometer chip. In some embodiments, the electronic unit 13 can include one photoelectric chip or package, so that the electronic unit 13 can be realized as a single pixel. In some embodiments, the electronic unit 13 can include multiple photoelectric chips or packages, so that it can be realized that the electronic unit 13 includes multiple pixels. In some embodiments, the electronic unit 13 can include red, blue, or green LED chips, Mini LED chips, or Micro LED chips, or other colors of LED, Mini LED, Micro LED or smaller chips or packages. When the three electronic components 131 (photoelectric chips or packages) of the electronic unit 13 are respectively red, blue and green LED, Mini LED, or Micro LED chips, a full-color LED, Mini LED, or micro LED display can be manufactured. The above-mentioned chip may be a die with horizontal electrodes, flip-chip electrodes, or vertical electrodes, wherein the electrodes thereof can be electrically connected by wire bonding or flip-chip bonding. To be understood, when the electronic component 131 is a photoelectric chip, each electronic unit 13 further includes an encapsulating layer (not shown), which is arranged continuously or discontinuously for separating the external moisture and dusts. The aforementioned package is not limited to a package with active components or a passive package without active components. Herein, the active component can be, for example but not limited to, a thin-film transistor (TFT), a silicon IC or a non-silicon IC. In some embodiments, the electronic device 1 can further include one or more active devices corresponding to at least one of the above-mentioned electronic component 131, and the active device can be, for example but not limited to, a thin-film transistor (TFT), a silicon IC or a non-silicon IC. In some embodiments, the electronic component 131 itself can be a driving component, which includes at least one thin-film transistor (TFT), a silicon IC or a non-silicon IC for driving other components or packages. Any board of the supporting board 11 or electrical board 12 in the electronic device 1 can be provided with the driving components and function as an active board, particularly an active-matrix board.

As shown in FIG. 1A, the four electronic units 13 of this embodiment are four electronic structures, each electronic structure has a carrier board 133, and the electronic component 131 is arranged on the carrier board 133. In other words, four independent electronic structures (electronic units 13) are tiled and arranged in a 2*2 array. Accordingly, when detecting out that one of the electronic units is failed, the failed electronic unit can be removed and replaced by a qualified electronic unit before disposing the electronic units 13 on the electrical board 12 (e.g. by attaching). Therefore, the failed part of the electronic device can be repaired easily, so that the electronic devices 1 can be manufactured with a high production yield. The present disclosure integrates the electronic components 131 into the form of electronic units. Thus, when one of the electronic components fails, only the electronic unit with the failed electronic component is removed and replaced instead of removing the entire electronic device 1. In addition, this disclosure can be applied to the micrometer or smaller electronic components, so that the electronic units are in the micrometer or larger electronic units that are electricity detectable. This disclosure is not limited thereto. The above-mentioned carrier board 133 can be a rigid board, a semi-rigid board, a resilient board, or a composite board. In some embodiments, the carrier board 133 can be a transparent board, a semi-transparent board or a non-transparent board, and this disclosure is not limited thereto.

In some embodiments, the above-mentioned electronic structure includes, for example but not limited to, an active device (or/and integrated components thereof) such as an thin-film transistors (TFT), a silicon IC or a non-silicon IC, or a passive device (or/and integrated components thereof) such as a capacitor, a resistor, an inductors, a conductor, an encoder, a potentiometer, an antenna, a transformer, a filter, an attenuator, a coupler, an oscillator, an RF component or a microwave (or millimeter wave) component.

Referring to FIG. 1C, each carrier board 133 is defined with a working surface S3 and a connecting surface S4 opposite to the working surface S3, and the electronic component 131 is arranged on the working surface S3. The carrier board 133 has a conductive layer 1331 and a through hole H2 communicating the working surface S3 and the connecting surface S4. Herein, the conductive layer 1331 is located on the working surface S3, and it can include, for example, a thin-film circuit. In addition, the through hole H2 is a hole passing through the carrier board 133 and the conductive layer 1331. The secondary conductive element 132 is arranged in the through hole H2, protruding from the through hole H2, and covering a part of the conductive layer 1331 located around the through hole H2, so that the secondary conductive element 132 can pass through the through hole H2 and electrically connect the conductive layer 1331 to the electrical layer 122 of the electrical board 12. In other words, the electronic component 131 is electrically connected to the electrical layer 122 of the electrical board 12 via the conductive layer 1331 of the carrier board 133 and the secondary conductive element 132 located in the through hole H2 (and on the conductive layer 1331). In some embodiments, the electrical board 12 further includes a plurality of driving components (not shown), and the driving components are respectively corresponding to the electronic components 131 of the electronic units 13 for driving the corresponding electronic components 131 of the electronic units 13. In this case, the driving components of the electrical board 12 are arranged on the first surface S1 or/and the second surface S2 of the board body 121, and this disclosure is not limited thereto. In addition, in some embodiments, since the electrical layer 122 of the electrical board 12 can be electrically connected to the circuit layer 111 of the supporting board 11 via the primary conductive element 123 in the through hole H1, the supporting board 11 can include a plurality of driving components (not shown). The driving components of the supporting board 11 can drive the corresponding electronic components 131 of the electronic units 13 via the electrical board 12. In addition, in some embodiments, the driving components can be arranged on the carrier board 133 of the electronic unit 13 for driving the corresponding electronic component 131. The above-mentioned driving component can include at least one thin-film transistor (TFT), silicon IC or non-silicon IC. In some embodiments, in addition to the thin-film transistor, the driving component can further include any of other thin-film components or circuits, such as thin-film resistor, capacitor, or insulation film. This disclosure is not limited thereto, and the driving component can be optionally determined based on the driving method of the electronic component 131. To be understood, since the driving components of the supporting board 11 or the active components of the electronic unit 13 have active driving characteristics, they can be realized as electronic components with the same function, or the driving components are electronic components containing the active components. The electronic device 1 can optionally include a plurality of driving components (corresponding to the electronic units 13) arranged on the supporting board 11, or each electronic unit 13 can be configured with one or more active components (corresponding to the electronic components 131 in this embodiment). Certainly, for a specific purpose, both of the supporting board 11 and the electronic unit 13 are provided with corresponding driving components or active components, and this disclosure is not limited thereto. It can also be understood that when the driving component or the active component is applied to the supporting board 11 or the electronic unit 13, the circuit layer 111 on the supporting board 11 provides pure current transmission, and this operation does not conflict with the above-mentioned embodiment(s).

In different embodiments, the carrier board 133 can have a conductive layer 1331 and a through hole communicating the working surface S3 and the connecting surface S4, while the through hole is sealed by the conductive layer 1331 or the conductive pads extending from the conductive layer 1331 (not shown). The secondary conductive element 132 is also arranged in the through hole. In other words, when viewing from the top of the carrier board 133, no matter the through hole is overlapped by the conductive layer 1331 or not, the secondary conductive element 132 in the through hole is electrically connected to the conductive layer 1331. In this embodiment, the conductive layer 1331 covers the through hole and the primary conductive element 132. In some embodiments, in addition to the conductive layer 1331, the carrier board 133 further includes a plurality of signal lines (e.g. scan lines and data lines) for transmitting the corresponding driving or control signals to the electronic component 131.

Referring to FIG. 1A, each electronic unit 13 of this embodiment includes three electronic components 131, which can be micro photoelectric chips (e.g. Micro LED chip) and electrically connected to the electrical layer 122 of the electrical board 12 via the secondary conductive elements 132. Certainly, in different embodiments, the number of the electronic components 131 in each electronic unit 13 can be one, two, or more than three, and each electronic component 131 can be a photoelectric chip or package in different size. This disclosure is not limited thereto.

In this embodiment, the three electronic components 131 (Micro LED chips) of each electronic unit 13 can have, for example, a common anode design or a common cathode design, which configures four connection ends. In this case, the three electronic components 131 has a common cathode design, so that there are three positive electrode ends and one common negative electrode end. As shown in FIG. 1B, the three positive electrode ends correspond to three smaller through holes H21 (H2) and three secondary conductive elements 132 in the corresponding through holes H21, the one negative electrode end corresponds to one larger through hole H22 (H2) and one secondary conductive element 132 in the corresponding through hole H22. Herein, the through holes H21 and the through hole H22 are all the through holes H2. Accordingly, the three electronic components 131 can be electrically connected to the electrical layer 122 of the electrical board 12 via the four secondary conductive elements 132 in the four through holes H2 (i.e., three H21 and one H22). In addition, in this embodiment, the secondary conductive elements 132 of the electronic units 13 and the primary conductive elements 123 of the electrical board 12 are arranged in dislocation in the projection direction of the electrical board 12. In some embodiments, the secondary conductive elements 132 of the electronic units 13 and the primary conductive elements 123 of the electrical board 12 are arranged in a stagger manner, especially according to a particular system, in the projection direction of the electrical board 12. In other words, the corresponding through hole H1 and the four through holes H2 corresponding to each electronic unit 13 are also arranged in dislocation in the projection direction of the electrical board 12.

In some embodiments, the through holes H2 of different carrier boards 133 having the same characteristics can correspond to one of the through holes H1, so that the number of the through holes H1 is equal to the number of different groups of though holes H2, wherein the through holes H2 of each group have the same characteristics and the through holes H2 of different groups have different characteristics. Taking the Micro LED chip as an example, the through holes H21 corresponding to the positive electrodes of the red Micro LED chips on multiple carrier boards 133 corresponds to one of the through holes H1. As a result, the multiple carrier boards 133 correspond to at least four through holes H1 in common. However, this disclosure is not limited thereto. For example, multiple carrier boards 133 on the same electrical board 12 correspond to at least four through holes H1 in common, while multiple carrier boards 133 on different electrical boards 12 can be electrically connected to two adjacent electronic units 13 on two adjacent carrier boards 133, respectively, via one or two conductive elements, so that the number of through holes can be reduced to less than four. For another example, whether on the same electrical board 12 or on multiple electrical boards 12, it is possible to reduce the number of through holes to less than four by the extension design of one or more extension circuit boards (e.g. flexible printed circuit boards or the like). To be understood, one corner of each electronic unit 13 can be overlapped by one through hole H1, which means that the four corners of each electronic unit 13 can be overlapped by different through holes H1; alternatively, one single through hole H1 can overlap one corner of one or ones of multiple electronic units 13, the same through hole H1 can overlap one corner of each of four electronic units 13, for example. The two descriptions define different contents, and the different contents do not conflict with each other and coexist.

In some embodiments, in the projection direction of the electric board 12, a ratio of the projection area of the electronic unit 13 to the projection area of the electronic component 131 is greater than or equal to 5. That is, (projection area of electronic unit 13)/(projection area of electronic component 131)≥5. For example, the projection area of the electronic unit 13 is 0.4 mm*0.4 mm=0.16 mm$^2$, and the projection area of the electronic component 131 is (3*0.0254)mm*(5*0.0254)mm=0.0096774 mm$^2$, so that (projection area of electronic unit 13)/(projection area of electronic component 131)>16.53. For another example, the projection area of the electronic unit 13 is 0.8 mm*0.8 mm=0.64 mm$^2$, and the projection area of the electronic component 131 is (5*0.0254)mm*(9*0.0254) mm=0.0290322 mm$^2$, so that (projection area of electronic unit 13)/(projection area of electronic component 131) >22.04. For another example, the projection area of the electronic unit 13 is 0.4 mm*0.4 mm=0.16 mm², and the projection area of the electronic component 131 is (5*0.0254)mm*(9*0.0254)mm=0.0290322 mm², so that (projection area of electronic unit 13)/(projection area of electronic component 131)>5.51.

In some embodiments, the ratio of the projection area of the electronic unit 13 to the projection area of the electronic component 131 can be greater than or equal to 50. For example, the projection area of the electronic unit 13 is 0.4 mm*0.4 mm=0.16 mm², and the projection area of the electronic component 131 is 0.03 mm*0.06 mm=0.0018 mm², so that (projection area of electronic unit 13)/(projection area of electronic component 131)=88.88. For another example, the projection area of the electronic unit 13 is 0.8 mm*0.8 mm=0.64 mm², and the projection area of the electronic component 131 is (3*0.0254)mm*(5*0.0254) mm=0.0096774 mm², so that (projection area of electronic unit 13)/(projection area of electronic component 131) >66.13. In some embodiments, the ratio of the projection area of the electronic unit 13 to the projection area of the electronic component 131 can be greater than or equal to 100. For example, the projection area of the electronic unit 13 is 0.46 mm*0.46 mm=0.2116 mm², and the projection area of the electronic component 131 is 0.03 mm*0.06 mm=0.0018 mm², so that (projection area of electronic unit 13)/(projection area of electronic component 131)=117.56. The values in the above examples are for illustrations only and are not to limit the scope of this disclosure. To be noted, the shapes of the projection areas of the electronic unit 13 and the electronic component 131 in the above calculation examples are squares, but this disclosure is not limited to squares.

In some embodiments, in the projection direction of the electric board 12, the electronic component 131 further defines a component width based on the size thereof, and the component width can be less than or equal to 80 mils (i.e., component width≤80 mils). In some embodiments, the component width can be less than or equal to 12 mils (i.e., component width≤12 mils). In some embodiments, the component width can be greater than or equal to 0.005 mm (i.e., component width≥0.005 mm). For example, the component width can be 0.008 mm, 0.01 mm, 3 mils, 4 mils, 5 mils, 7 mils, etc.

As mentioned above, in the electronic device 1 of this embodiment, the through holes H1 of the electrical board 12 communicate with the first surface S1 and the second surface S2 of the board body 121, the primary conductive elements 123 are respectively arranged in the through holes H1 and electrically connect the electrical layer 122 of the electrical board 12 to the circuit layer 111 of the supporting board 11, the electronic units 13 are arranged on the first surface S1 of the board body 121 of the electrical board 12, each electronic unit 13 is partially overlapped with one of the through holes H1 of the electrical board 12 in a projection direction of the electrical board 12, and the secondary conductive elements 132 (or the through holes H2) of the electronic units 13 and the primary conductive elements 123 (or the through holes H1) of the electrical board 12 are arranged in dislocation in the projection direction of the electrical board 12. Based on this design, the electronic device 1 can be manufactured as an electronic product having a novel connection technology for connecting the electronic units and the supporting board.

Figure 2:
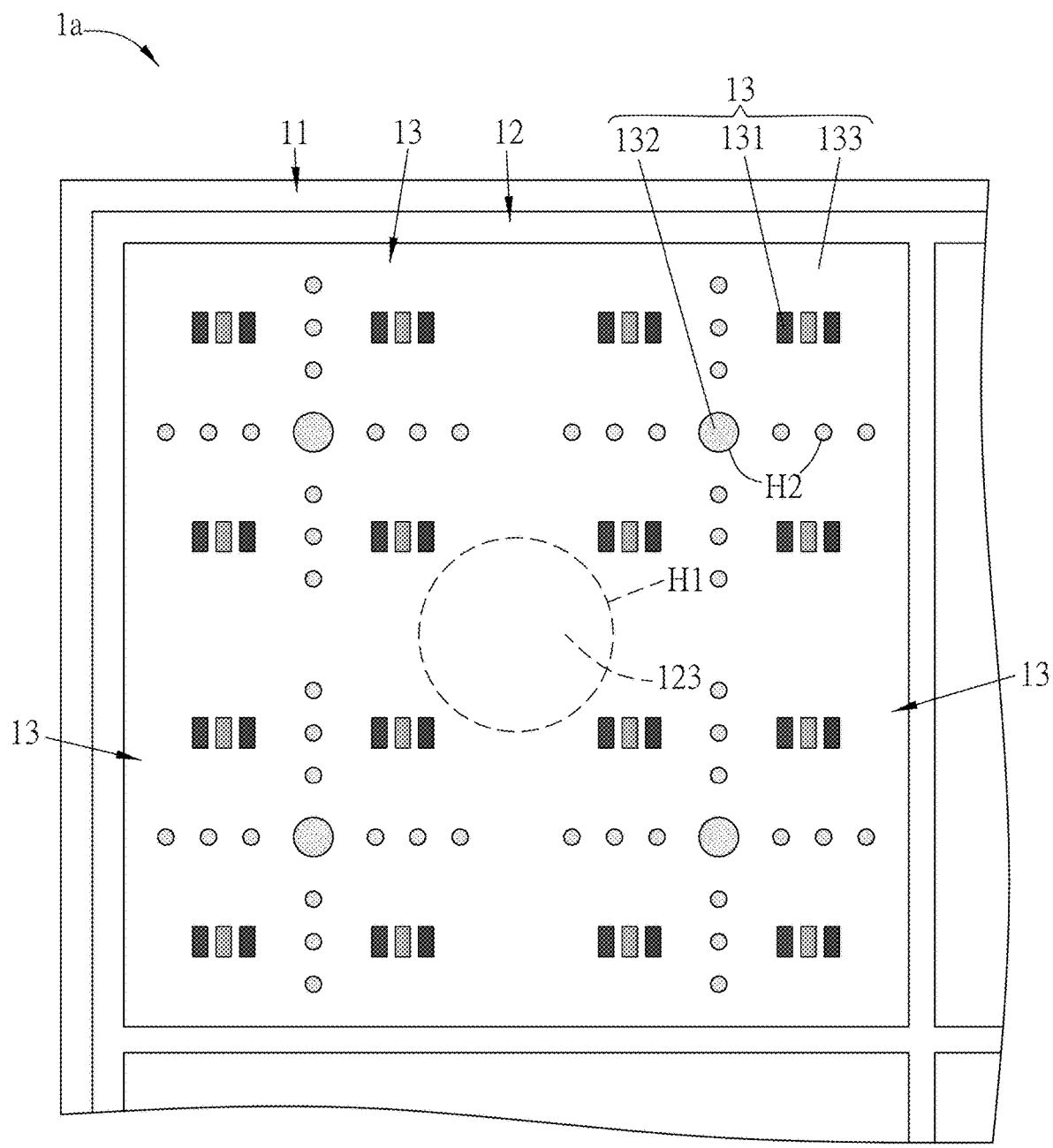
FIGS. 2 to 4 are schematic diagrams showing parts of electronic devices according to different embodiments of this disclosure.
Figure 3:
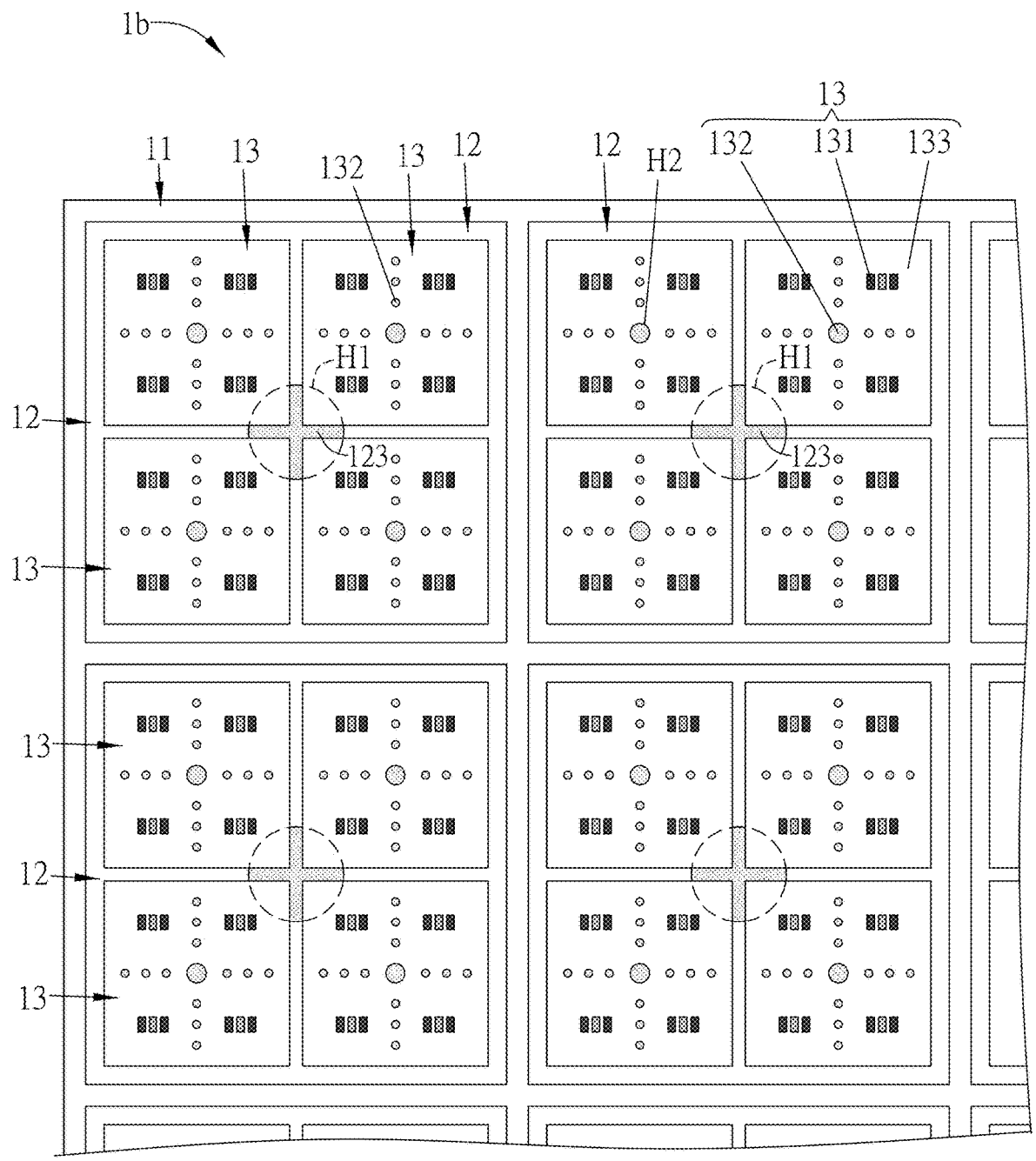
Figure 4:
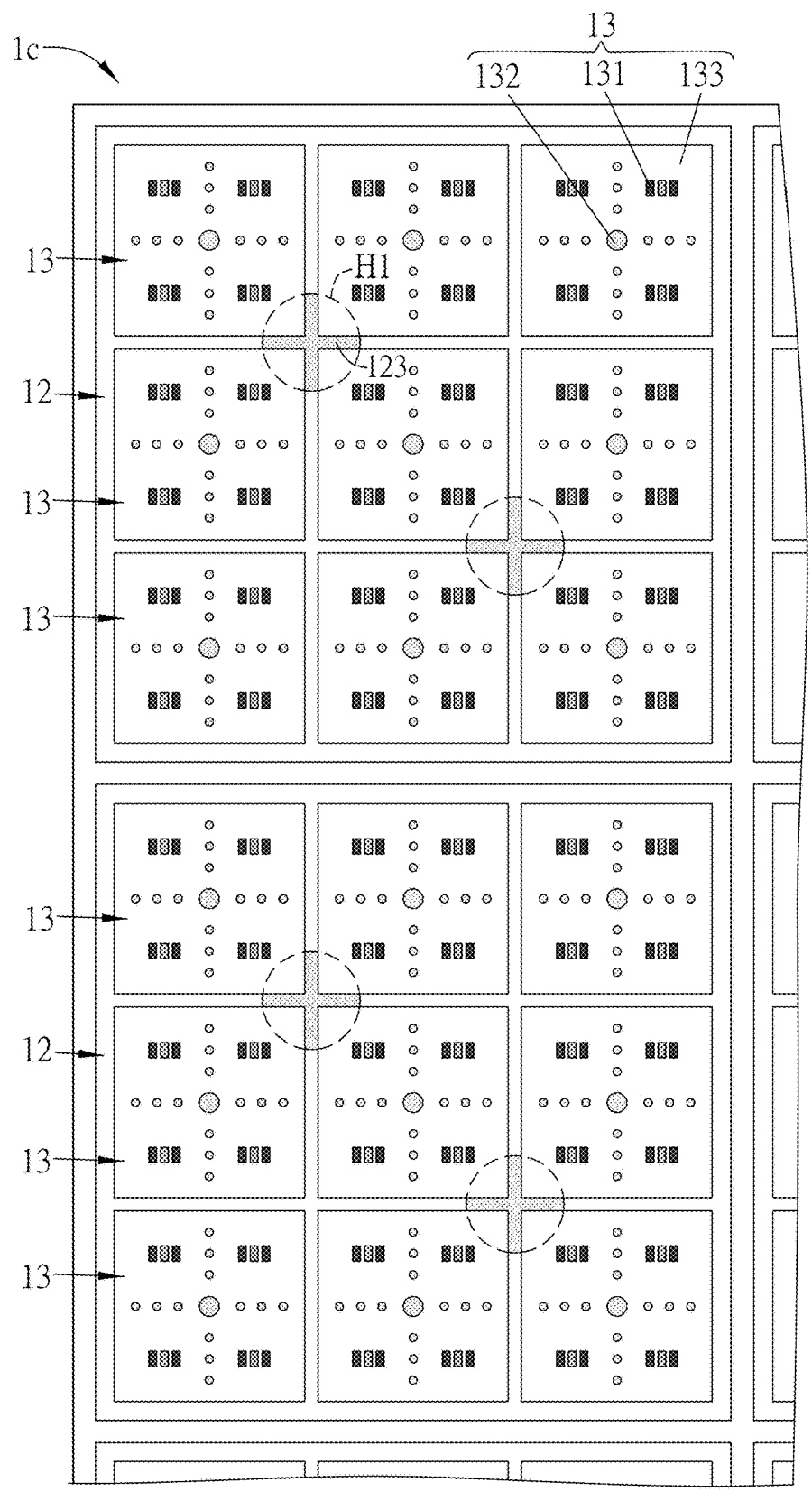

FIGS. 2 to 4 are schematic diagrams showing parts of electronic devices according to different embodiments of this disclosure Unlike the electronic device 1 of the previous embodiment, in the electronic device 1a of this embodiment as shown in FIG. 2, four electronic units 13 form one electronic structure, the electronic structure includes a carrier board 133, and the electronic components 131 of the electronic units 13, which are virtually defined, are arranged on the carrier board 133. In other words, four electronic units 13 together form one electronic structure, and share one carrier board 133 in common. Accordingly, when detecting out that one of the electronic units is failed, the failed electronic unit can be removed (e.g. by laser slice and ablation), which means a cut will be formed on the carrier board 133, before disposing (e.g. by attaching) the electronic structure (the carrier board 133 with a cut) on the electrical board 12, and then a qualified electronic unit 13 is disposed to fit the cut of the carrier board 133. Therefore, the failed part can be repaired easily, so that the electronic devices 1a can be manufactured with a high production yield.

In addition, unlike the electronic device 1 of the previous embodiment, the electronic device 1b of this embodiment as shown in FIG. 3 includes a plurality of electrical boards 12, and the electrical boards 12 are tiled, for example, in a two-dimensional array. In this embodiment, each electrical board 12 is provided with four electronic units 13, which are arranged in a 2*2 array, and the secondary conductive elements 132 of the four electronic units 13 and the primary conductive elements 123 of the electrical board 12 are arranged in dislocation in the projection direction of the electrical board 12.

In addition, unlike the electronic device 1b of the previous embodiment, in the electronic device 1c of this embodiment as shown in FIG. 4, each electrical board 12 is provided with nine electronic units 13, which are arranged in a 3*3 array. In each electronic board 12, the nine electronic units 13 are electrically connected to the circuit layer 111 of the supporting board 11 via the primary conductive elements 123 in two through holes H1. In other words, one electronic unit 13 located between two through holes H1 utilizes two primary conductive elements 123 of two through holes H1 to electrically connect to the circuit layer 111 of the supporting board 11.

Figure 5A:
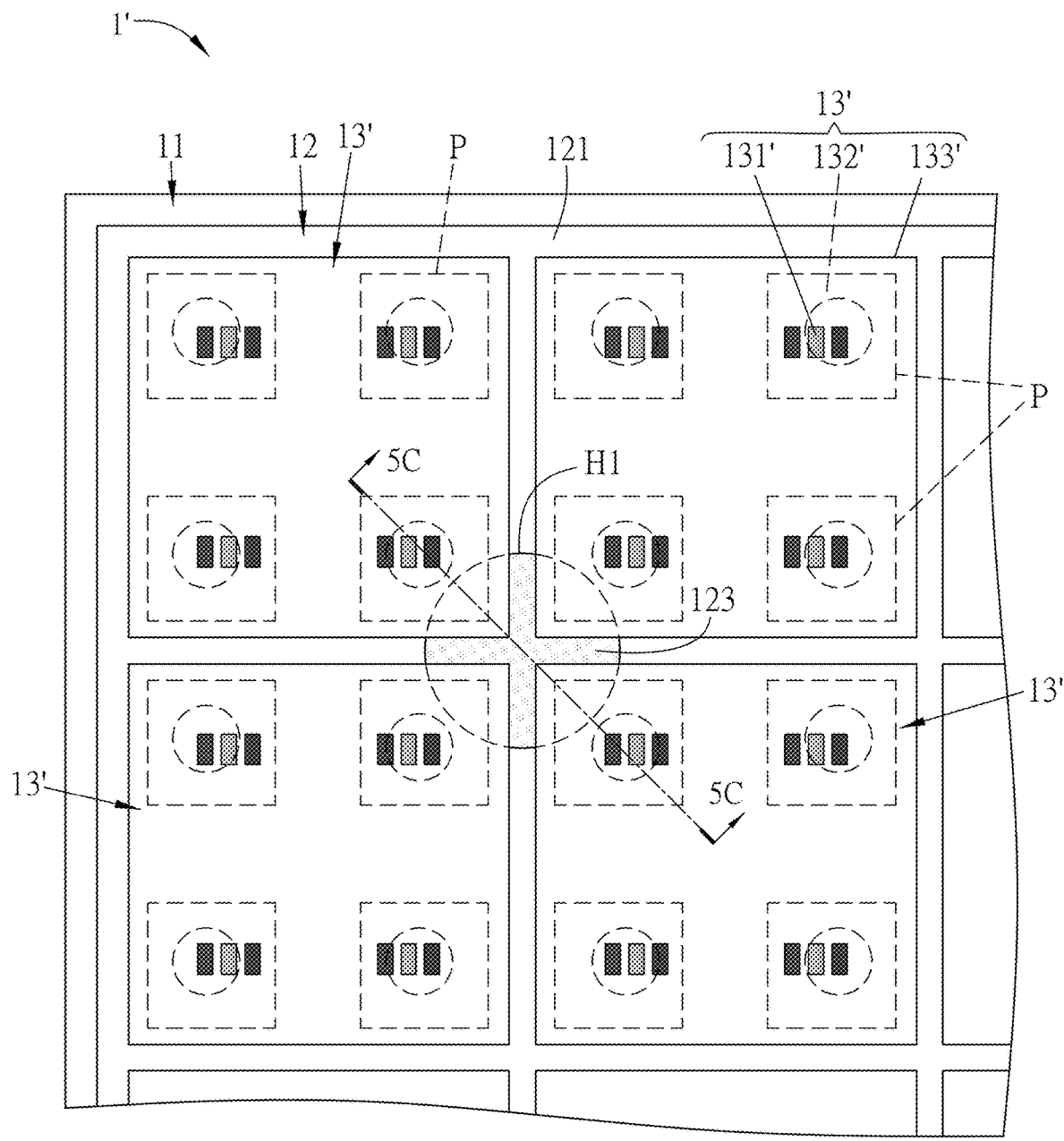
FIG. 5A is a schematic diagram showing a part of an electronic device according to another embodiment of this disclosure.
Figure 5B:
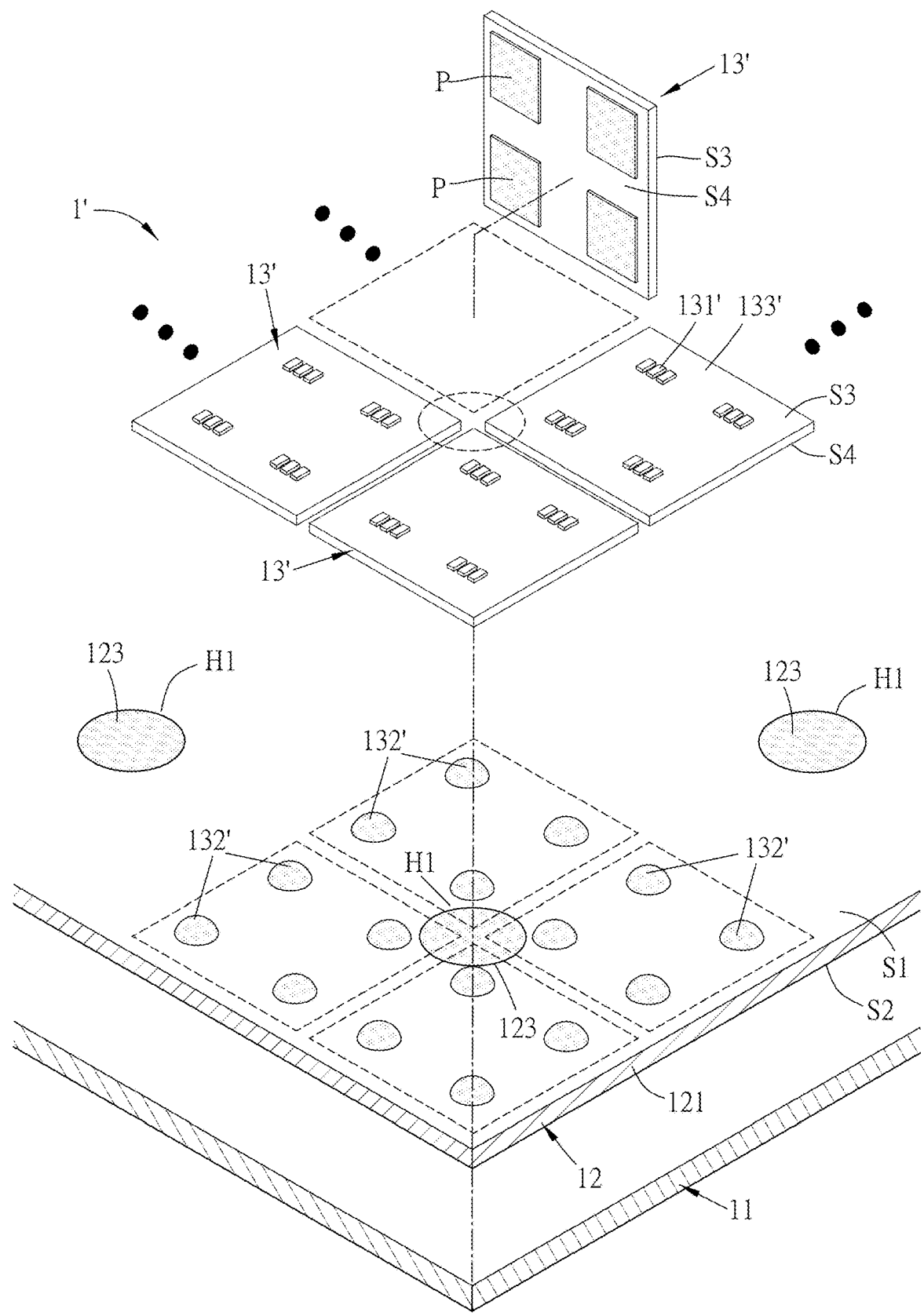
FIG. 5B is an exploded view of a part of the electronic device of FIG. 5A.

The electronic device according to another embodiment of this disclosure can be also applied to any of the aspects as shown in FIGS. 1A to 4, while at least one of the through holes H1 and the through holes H2 can be omitted. FIG. 5A is a schematic diagram showing a part of an electronic device according to another embodiment of this disclosure, wherein the through hole H2 is omitted; FIG. 5B is an exploded view of a part of the electronic device of FIG. 5A; and FIG. 5C is a sectional view of the electronic device of FIG. 5A along the line 5C-5C.

Figure 5C:
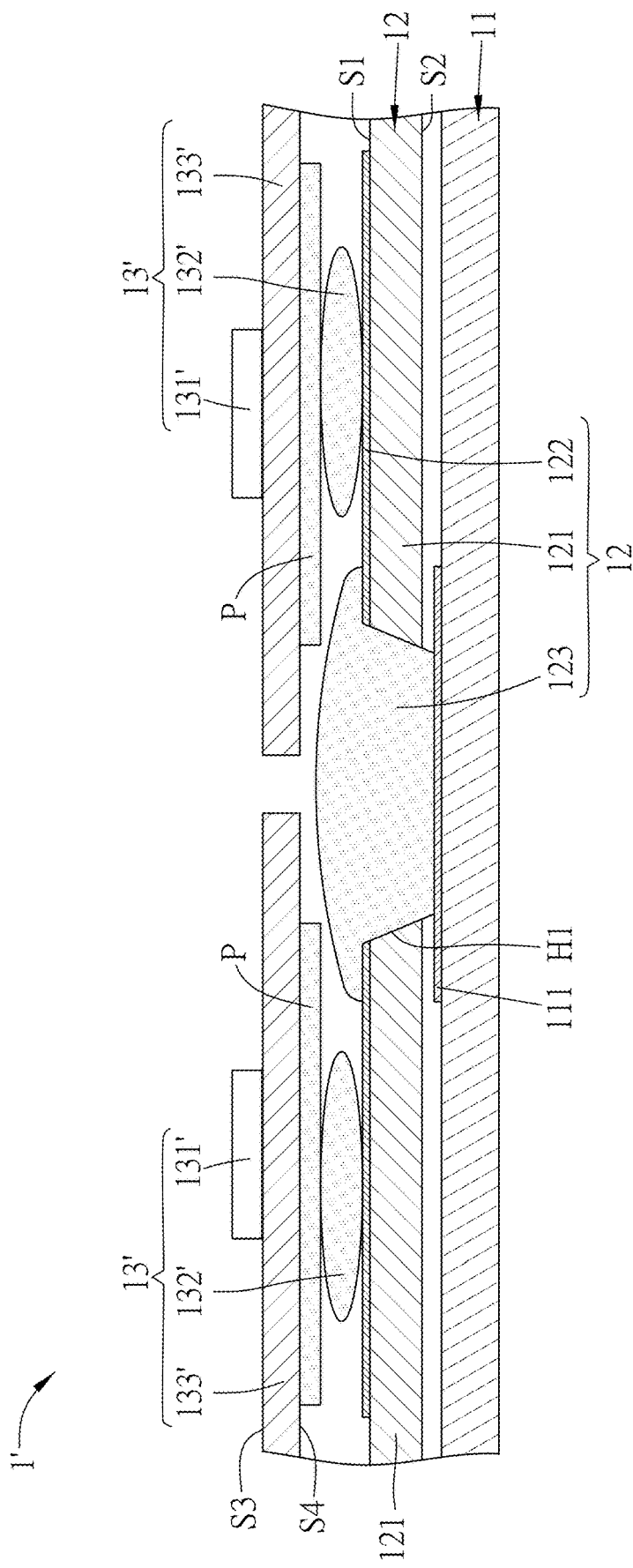
FIG. 5C is a sectional view of the electronic device of FIG. 5A along the line 5C-5C.

As shown in FIGS. 5A to 5C, the connecting surface S4 of the carrier board 133' can be configured with a plurality of conductive pads P, and the conductive pads P can be electrically connected to the electronic components 131' through the conductive layer (not shown) of the carrier board 133'. The electronic unit 13' can electrically connect the conductive pads P to the electrical layer 122 of the electrical board 12 via the multiple secondary conductive elements 132'. In this case, the conductive layer of the carrier board 133' can be arranged on the working surface S3, on the connecting surface S4, or between the working surface S3 and the connecting surface S4. The secondary conductive elements 132' can be solder balls, solder paste, or their equivalent. The secondary conductive elements 132' can be arranged on the electrical board 12 or on the carrier board 133'. When the secondary conductive elements 132' are arranged on the carrier board 133', the conductive pads P may not be viewed. The amounts of the conductive pads P and the secondary conductive elements 132' can be, for example but not limited to, the number of the electronic components 131 having the common cathode or anode design. Each electronic unit 13' can be one surface mounted device (SMD), and the electronic unit 13' can further include an encapsulation element or layer arranged on the carrier board 133' for covering the electronic components 131'. To be understood, each electronic unit 13' can directly contact and electrically connect to the primary conductive element 123 in the through hole H1 via one of the secondary conductive elements 132' (direct-contact electrical connection); or the secondary conductive elements 132' of each electronic unit 13' can electrically connect to the electrical layer 122 of the electrical board 12 and then be electrically connected to the primary conductive element 123 in the through hole H1 via the electrical layer 122 of the electrical board 12 (indirect-contact electrical connection); or the conductive pads P can be the extensions of the electrical layer 122 or a part of the electrical layer 122. To be understood, when each electronic unit 13' is electrically connected to the primary conductive element 123 in the through hole H1 as one of the secondary conductive elements 132' directly or indirectly contact the primary conductive element 123, every two of the conductive pads P, the secondary conductive elements 132' and the primary conductive elements 123 are arranged in dislocation in the projection direction of the electrical board 12 as long as they can be electrically connected to each other. Herein, the dislocation means that the secondary conductive elements 132' and the primary conductive elements 123 are completely or partially overlapped or staggered in the projection direction of the electrical board 12 as long as the secondary conductive elements 132' and the primary conductive elements 123 are not completely overlapped (covered).

In other words, when viewing from the top of the carrier board 133', at least a part or all of each secondary conductive element 132' is overlapped by the carrier board 133' and cannot be viewed. When a plurality of carrier boards 133' all cover one primary conductive element 123 in the through hole H1 (the same as the previous embodiment), the primary conductive element 123 can be completely covered or slightly exposed. In this embodiment, the electronic component 131' is electrically connected to the electrical layer 122 of the electrical board 12 via the conductive layer (and the conductive pads P) of the carrier board 133' and the secondary conductive element 132', and the electrical layer 122 of the electrical board 12 is electrically connected to the circuit layer 111 of the underneath supporting board 11 via the primary conductive element 123 in the through hole H1. Accordingly, the electrical signals can be transmitted through the circuit layer 111, the electrical layer 122 and the primary conductive element 123. To be understood, one corner of each electronic unit 13' can be overlapped by one primary conductive element 123, so that four corners of each electronic unit 13' can be overlapped by different primary conductive elements 123; alternatively, one primary conductive element 123 can overlap corners of one or ones electronic units 13', one primary conductive element 123 can overlap one corner of each of four electronic units 13', for example. The two descriptions define different contents, and the different contents do not conflict with each other and coexist.

The electronic device according to another embodiment of this disclosure can be also applied to any of the aspects as shown in FIGS. 1A to 4, while the through holes H1 are omitted (not shown). In this case, the electrical board does not include the through holes H1, and the electrical layer of the electrical board is electrically connected to the circuit layer of the supporting board by surface mount technology. The electronic units can be arranged on the electrical board before or after the step of arranging the electrical board on the supporting board, and the process order is not limited. In some embodiments, the electronic units can be arranged on the electrical board before arranging the electrical board on the supporting board, so that the electronic units and the electrical board are manufactured as one unit or module.

The electronic device according to another embodiment of this disclosure can be also applied to any of the aspects as shown in FIGS. 1A to 4, while the through holes H1 and the through holes H2 are omitted. The detailed descriptions thereof are not repeated here.

As mentioned above, in the electronic device of this disclosure, the primary conductive elements electrically connect the electrical layer of the electrical board to the circuit layer of the supporting board, the electronic units are electrically connected to the conductive layer of the carrier board and the electrical layer of the electrical board via the secondary conductive elements, and the secondary conductive elements of the electronic units and the primary conductive elements of the electrical board are arranged in dislocation in the projection direction of the electrical board. Accordingly, the electronic device of this disclosure can be manufactured as an electronic product having a novel connection technology. The electronic device of this disclosure has the following advantages of: reducing the overall size of the electronic device, increasing the density of electronic units in the electronic device, making the carrier board or the electrical board have visual consistency after splicing process (with equal pitch), easy to eliminate or repair defective products, and improving production yield of electronic devices. In addition, the primary conductive elements and the secondary conductive elements can be arranged in dislocation so as to achieve the electrical connection effect. The projection size of the primary conductive element can be remained as the pitches between the electronic components decrease, which is benefit in increasing the arrangement density of the electronic components. Based on the structure of electronic device of this disclosure and the electrical connection between the components thereof, when detecting out that one of multiple electronic units is failed, the failed electronic unit can be removed and replaced by a qualified electronic unit before arranging the electronic units on the electrical board 12. Therefore, the failed part can be repaired easily, and the electronic devices can be manufactured with a high production yield. The present disclosure integrates the electronic components into the form of electronic units. Thus, when one of the electronic components fails, only the electronic unit with the failed electronic component is removed and replaced instead of removing the entire electronic device. Accordingly, the defective components of the electronic device of this disclosure can be easily eliminated and repaired, thereby increasing the production yield of the electronic devices. To be understood, each of the electronic units, electrical boards and supporting boards can be an independent electronic structure, which can be electrically connected in dislocation by the through holes or surface mount technology.

Although the disclosure has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the disclosure.

What is claimed is:

1. An electronic device, comprising:
a supporting board provided with a circuit layer;
an electrical board having a board body, a plurality of through holes passing through the board body, an electrical layer arranged on the board body, and a plurality of primary conductive elements respectively arranged in the through holes, wherein the board body is defined with a first surface and a second surface opposite to each other, the through holes communicate with the first surface and the second surface of the board body, and the primary conductive elements electrically connect the electrical layer to the circuit layer of the supporting board; and
a plurality of electronic units arranged on the first surface of the board body, wherein each of the electronic units is partially overlapped with one of the through holes in a projection direction of the electrical board, each of the electronic units has an electronic component and a secondary conductive element electrically connecting the electronic component to the electrical layer;
wherein, the secondary conductive elements of the electronic units and the primary conductive elements of the electrical board are arranged in dislocation in the projection direction of the electrical board.

2. The electronic device of claim 1, wherein each of the electronic units defines a plurality of corners, and one of the corners of each of the electronic units is overlapped by one of the through holes in the projection direction of the electrical board.

3. The electronic device of claim 1, wherein each of the electronic units defines a plurality of corners, and one of the through holes overlaps the corners of one or ones of the electronic units in the projection direction of the electrical board.

4. The electronic device of claim 1, wherein the electronic units are arranged in an m*n array, and cover at least one of the through holes in the projection direction of the electrical board, and m and n are equal or unequal positive integers.

5. The electronic device of claim 1, wherein each of the electronic units comprises a plurality of the secondary conductive elements, and each of the secondary conductive elements electrically connects the corresponding electronic component to the electrical layer.

6. The electronic device of claim 1, wherein the electronic device comprises a plurality of the electrical boards.

7. The electronic device of claim 1, wherein each of the supporting board and the board body of the electrical board are resilient.

8. An electronic device, comprising:
a supporting board provided with a circuit layer;
an electrical board having a board body, an electrical layer arranged on the board body, and a plurality of primary conductive elements electrically connected to the electrical layer, wherein the board body is defined with a first surface and a second surface opposite to each other, and the primary conductive elements electrically connect the electrical layer to the circuit layer of the supporting board; and
a plurality of electronic units arranged on the first surface of the board body, wherein each of the electronic units is partially overlapped with one of the primary conductive elements in a projection direction of the electrical board, each of the electronic units has an electronic component and a secondary conductive element electrically connecting the electronic component to the electrical layer;
wherein, the secondary conductive elements of the electronic units and the primary conductive elements of the electrical board are arranged in dislocation in the projection direction of the electrical board.

9. The electronic device of claim 8, wherein each of the electronic units is a surface mounted device.

10. The electronic device of claim 8, wherein each of the electronic units defines a plurality of corners, and one of the corners of each of the electronic units is overlapped by one of the primary conductive elements in the projection direction of the electrical board.

11. The electronic device of claim 8, wherein each of the electronic units defines a plurality of corners, and one of the primary conductive elements overlaps the corners of one or ones of the electronic units in the projection direction of the electrical board.

12. The electronic device of claim 8, wherein the electronic units are a plurality of electronic structures, each of the electronic structures comprises a carrier board, and the electronic component is arranged on the carrier board.

13. The electronic device of claim 8, wherein the electronic component is a micro photoelectric chip.

14. The electronic device of claim 8, wherein the electronic unit further comprises an encapsulation layer for encapsulating the electronic component.

15. The electronic device of claim 8, wherein the electronic units form an electronic structure, the electronic structure comprises a carrier board, and the electronic components of the electronic units are arranged on the carrier board.

16. The electronic device of claim 8, wherein the electronic units are arranged in an m*n array, and cover at least one of the primary conductive elements in the projection direction of the electrical board, and m and n are positive integers.

17. The electronic device of claim 8, wherein each of the electronic units comprises a plurality of the secondary conductive elements, and each of the secondary conductive elements electrically connects the corresponding electronic component to the electrical layer.

18. The electronic device of claim 8, wherein the secondary conductive element of each of the electronic units is a solder bump.

19. The electronic device of claim 8, wherein the electrical board further comprises a plurality of driving components, and the driving components are respectively corresponding to the electronic components of the electronic units.

20. The electronic device of claim 19, wherein the driving component is a thin-film transistor (TFT) or an integrated circuit (IC).

* * * * *